United States Patent
Khakifirooz et al.

(10) Patent No.: US 10,109,361 B1
(45) Date of Patent: Oct. 23, 2018

(54) COARSE PASS AND FINE PASS MULTI-LEVEL NVM PROGRAMMING

(71) Applicant: Intel Corporation, Santa Clara, CA (US)

(72) Inventors: Ali Khakifirooz, Folsom, CA (US); Pranav Kalavade, San Jose, CA (US); Rohit S. Shenoy, Fremont, CA (US); Aliasgar S. Madraswala, Folsom, CA (US); Donia Sebastian, Fair Oaks, CA (US); Xin Guo, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/637,481

(22) Filed: Jun. 29, 2017

(51) Int. Cl.
*G11C 16/04* (2006.01)
*G11C 16/34* (2006.01)

(52) U.S. Cl.
CPC ...... *G11C 16/3481* (2013.01); *G11C 16/0483* (2013.01); *G11C 2211/5622* (2013.01); *G11C 2216/14* (2013.01)

(58) Field of Classification Search
CPC ............ G11C 16/3481; G11C 16/0483; G11C 2211/5622; G11C 2216/14
See application file for complete search history.

(56) References Cited

U.S. PATENT DOCUMENTS

| | | | |
|---|---|---|---|
| 7,710,781 B2 | 5/2010 | Haque et al. | |
| 7,805,660 B2* | 9/2010 | Hazama | G06F 11/1072 714/773 |
| 8,060,719 B2* | 11/2011 | Radke | G06F 12/0246 711/103 |
| 8,248,862 B2 | 8/2012 | Di Iorio et al. | |
| 8,261,009 B2* | 9/2012 | Freikorn | G06F 12/0246 711/103 |
| 8,281,061 B2* | 10/2012 | Radke | G11C 11/5628 711/103 |
| 8,982,625 B2 | 3/2015 | Goda et al. | |
| 9,001,577 B2 | 4/2015 | Goldman et al. | |
| 9,245,645 B2 | 1/2016 | Srinivasan et al. | |
| 9,396,791 B2 | 7/2016 | Raghunathan et al. | |
| 9,418,752 B2 | 8/2016 | Rajwade et al. | |
| 9,543,019 B2 | 1/2017 | Frickey et al. | |

OTHER PUBLICATIONS

Micron Technology, Inc., "NAND Flash 101", Technical Note, Retrieved Jun. 23, 2017, 27 pages, <https://www.micron.com/~/media/documents/products/technical-note/nand-flash/tn2919_nand_101.pdf>.

* cited by examiner

*Primary Examiner* — Pho M Luu
(74) *Attorney, Agent, or Firm* — Jordan IP Law, LLC

(57) ABSTRACT

A memory programmer apparatus may include a first-level programmer to program a first-level cell portion of a multi-level memory in a first pass, a coarse programmer to coarse program a second-level cell portion of the multi-level memory in the first pass, wherein the second-level cell portion includes more levels than the first-level cell portion, and a fine programmer to fine program the second-level cell portion of the multi-level memory in a second pass from data programmed in the first-level cell portion in the first pass.

25 Claims, 7 Drawing Sheets

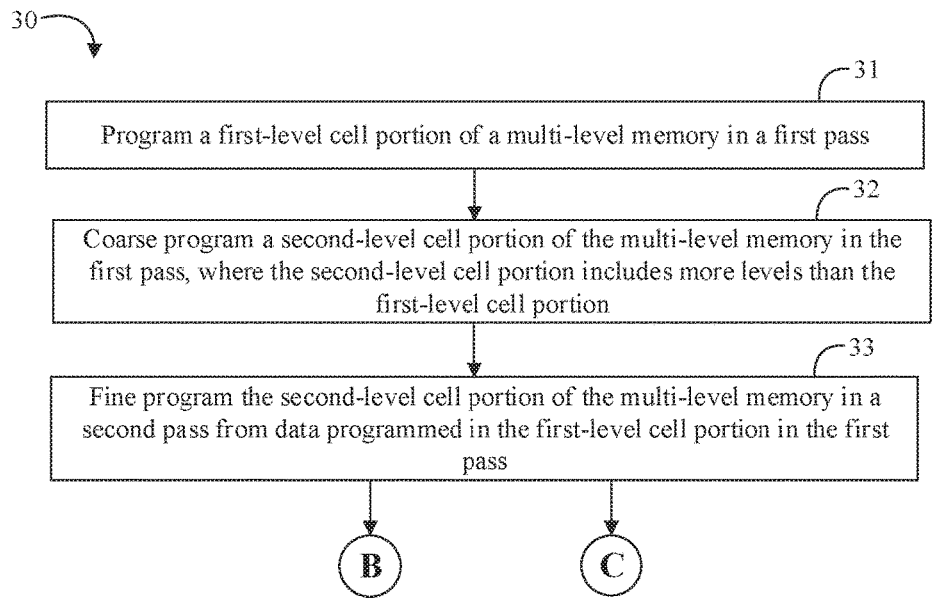
FIG. 3A
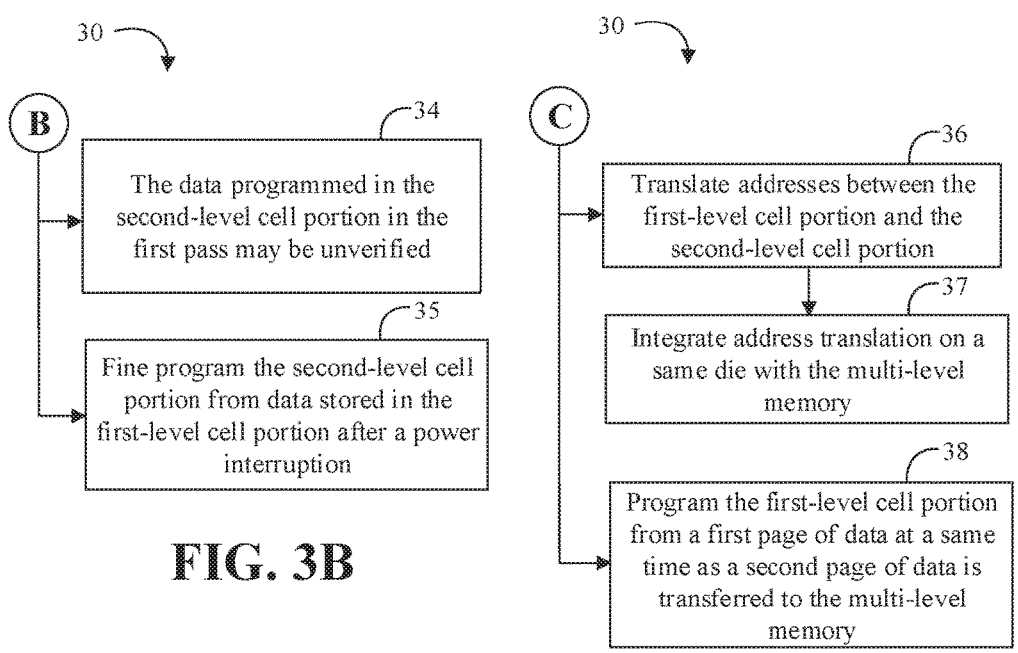
FIG. 3B
FIG. 3C

US 10,109,361 B1

COARSE PASS AND FINE PASS MULTI-LEVEL NVM PROGRAMMING

TECHNICAL FIELD

Embodiments generally relate to memory systems. More particularly, embodiments relate to coarse pass and fine pass multi-level NVM programming.

BACKGROUND

A multi-level non-volatile memory stores more than one bit per cell. Multi-level NAND memory having four (4) possible voltage levels per cell, may represent two (2) bits of data per cell. NAND memory having eight (8) voltage levels per cell may be referred to as triple-level cell (TLC) memory and may represent three (3) bits of data per cell. NAND memory having sixteen (16) voltage levels per cell may be referred to as quad-level cell (QLC) memory and may represent four (4) bits of data per cell. With some NAND flash devices, erasing a block may set all bit values to 1. Programming may refer to the process of changing an erased bit from a bit value of 1 to a bit value of 0.

BRIEF DESCRIPTION OF THE DRAWINGS

The various advantages of the embodiments will become apparent to one skilled in the art by reading the following specification and appended claims, and by referencing the following drawings, in which:

FIGS. 3A to 3C are flowcharts of an example of a method of programming a memory according to an embodiment;

DESCRIPTION OF EMBODIMENTS

Various embodiments described herein may include a memory component and/or an interface to a memory component. Such memory components may include volatile and/or nonvolatile memory. Nonvolatile memory may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory may be a storage medium that requires power to maintain the state of data stored by the medium. Non-limiting examples of volatile memory may include various types of RAM, such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Figure 1:
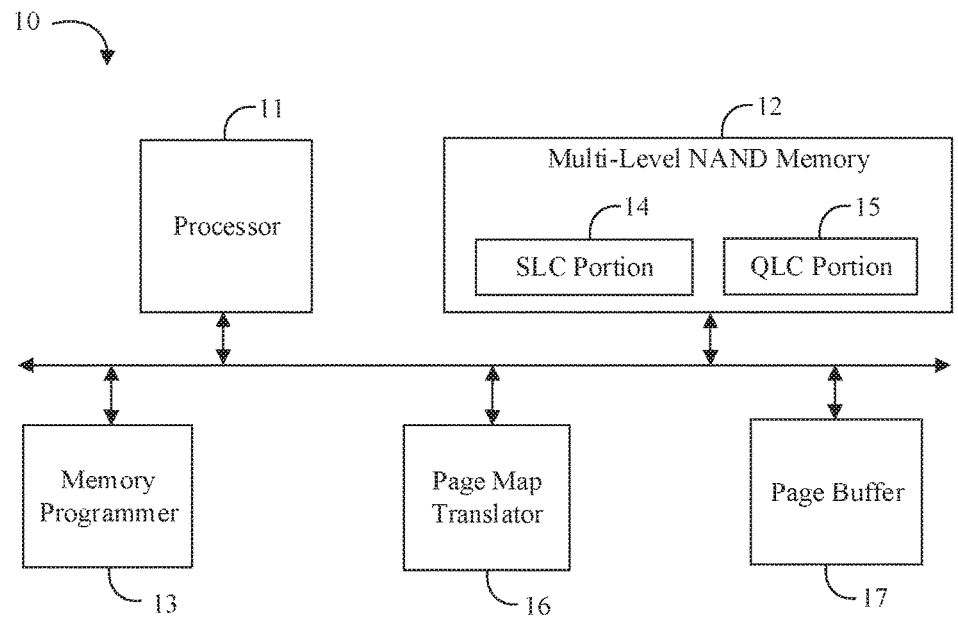
FIG. 1 is a block diagram of an example of an electronic processing system according to an embodiment.

Turning now to FIG. 1, an embodiment of an electronic processing system 10 may include a processor 11, a multi-level NAND memory 12 communicatively coupled to the processor 11, and a memory programmer 13 communicatively coupled to the multi-level NAND memory 12 to program the multi-level NAND memory 12. In some embodiments, the multi-level NAND memory 12 may include a single-level cell (SLC) portion 14 and a quad-level cell (QLC) portion 15. The memory programmer 13 may advantageously be configured to program the SLC portion 14 in a first pass, coarse program the QLC portion 15 in the first pass, and fine program the QLC portion 15 in a second pass from data programmed in the SLC portion 14 in the first pass. For example, the data programmed in the QLC portion 15 in the first pass may be unverified. In some embodiments, the memory programmer 13 may be further configured to fine program the QLC portion 15 from data stored in the SLC portion 14 after a power interruption. As described in more detail below, some embodiments may work with other multi-level portions (e.g., TLC, etc.). In some embodiments, the memory programmer 13 may include or be incorporated with a memory controller.

Some embodiments of the system 10 may further include a page map translator 16 communicatively coupled to the multi-level NAND memory 12 to translate addresses between the SLC portion 14 and the QLC portion 15. In some embodiments, for example, the page map translator 16 may be integrated on a same die with the multi-level NAND memory 12. The system 10 may also include a page buffer 17 communicatively coupled to the memory programmer 13 to store a page of data, where the memory programmer 13 may be configured to program the SLC portion 14 from a first page of data stored in the page buffer 17 at a same time as a second page of data is transferred to the page buffer 17.

Embodiments of each of the above processor 11, multi-level NAND memory 12, memory programmer 13, SLC portion 14, QLC portion 15, page map translator 16, page buffer 17, and other system components may be implemented in hardware, software, or any suitable combination thereof. For example, hardware implementations may include configurable logic such as, for example, programmable logic arrays (PLAs), field programmable gate array (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof.

Alternatively, or additionally, all or portions of these components may be implemented in one or more modules as a set of logic instructions stored in a machine- or computer-readable storage medium such as RAM, read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the multi-level NAND memory 12, other persistent storage media, or other system memory may store a set of instructions which when executed by the processor 11 cause the system 10 to implement one or more components, features, or aspects of the system 10 (e.g., the memory programmer 13, etc.).

Figure 2:
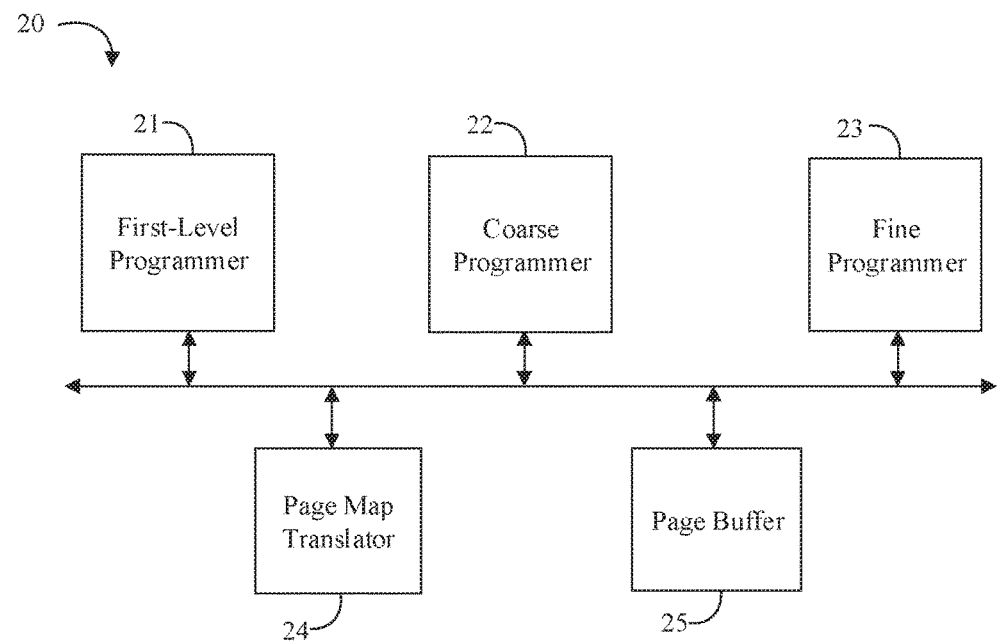
FIG. 2 is a block diagram of an example of a memory programmer apparatus according to an embodiment.

Turning now to FIG. 2, an embodiment of a memory programmer apparatus 20 may include a first-level programmer 21 to program a first-level cell portion of a multi-level memory in a first pass, a coarse programmer 22 to coarse program a second-level cell portion of the multi-level memory in the first pass, where the second-level cell portion includes more voltage levels than the first-level cell portion, and a fine programmer 23 to fine program the second-level cell portion of the multi-level memory in a second pass from data programmed in the first-level cell portion in the first pass. For example, the data programmed in the second-level cell portion in the first pass may be unverified. In some embodiments, the fine programmer 23 may be further configured to fine program the second-level cell portion from data stored in the first-level cell portion after a power interruption.

Some embodiments of the apparatus 20 may further include a page map translator 24 communicatively coupled to one or more of the first-level programmer 21, the coarse programmer 22, and/or the fine programmer 23 to translate addresses between the first-level cell portion and the second-level cell portion. In some embodiments, for example, the page map translator 24 may be integrated on a same die with the multi-level non-volatile memory. Some embodiments may also include a page buffer 25 communicatively coupled to the first-level programmer 21 to store a page of data, where the first-level programmer 21 may be configured to program the first-level cell portion from a first page of data stored in the page buffer 25 at a same time as a second page of data is transferred to the page buffer 25.

Embodiments of each of the above first-level programmer 21, coarse programmer 22, fine programmer 23, page map translator 24, page buffer 25, and other components of the apparatus 20 may be implemented in hardware, software, or any combination thereof. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Alternatively, or additionally, these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Turning now to FIGS. 3A to 3C, an embodiment of a method 30 of programming a multi-level non-volatile memory may include programming a first-level cell portion of a multi-level memory in a first pass at block 31, coarse programming a second-level cell portion of the multi-level memory in the first pass, where the second-level cell portion includes more levels than the first-level cell portion at block 32, and fine programming the second-level cell portion of the multi-level memory in a second pass from data programmed in the first-level cell portion in the first pass at block 33. For example, the data programmed in the second-level cell portion in the first pass may be unverified at block 34. The method 30 may further include fine programming the second-level cell portion from data stored in the first-level cell portion after a power interruption at block 35.

Some embodiments of the method 30 may also include translating addresses between the first-level cell portion and the second-level cell portion at block 36 and/or integrating address translation on a same die with the multi-level memory at block 37. In some embodiments, the method 30 may also include programming the first-level cell portion from a first page of data at a same time as a second page of data is transferred to the multi-level memory at block 38.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages. For example, the method 30 may be implemented on a computer readable medium as described in connection with Examples 19 to 24 below. For example, embodiments or portions of the method 30 may be implemented in applications (e.g., through an application programming interface (API)) or driver software running on an operating system (OS).

Some embodiments may provide a method of programming NAND memory, such as QLC NAND products. Some embodiments may advantageously improve the programming speed of a multi-bit per cell NAND memory and in particular the programming speed of 4-bit per cell QLC NAND memory by improving the speed of a first pass of the programming in a two-pass programming scheme. For example, some embodiments may provide 2-pass programming where the first pass is performed significantly faster than some other 2-pass programming techniques.

Without being limited to theory of operation, in some other QLC NAND memories, starting from an erased state a word-line WLn is programmed to an 8-voltage level (state) per cell based on the user data provided for 3 pages (first pass for WLn). Then a next neighboring word-line WLn+1 is programmed to an 8-level per cell state (first pass for WLn+1). Due to the coupling between WLn+1 and WLn cells, the 8-level placement of WLn cells is affected at this stage. However, because this is not the final 16-level placement, it is more forgiving with respect to the aggression from WLn+1 placement. Then WLn is programmed to its final 16-level per cell state based on its current content (3 pages of data written in the first pass) and one additional page of data provided by the user (second pass for WLn). By doing so, once WLn is in its 16-level per cell state, its threshold voltage (Vt) placement is only affected by programming WLn+1 from 8-level to 16-level per cell state which is a significantly smaller aggression compared to programming WLn+1 from an erased state to an 8-level per cell state. In some implementations, this other programming technique may be referred to as an 8-16 programming technique.

In the foregoing 8-16 programming technique (e.g. which may be part of a write operation), the first pass placement encodes the data from 3 pages of user data. Correct placement of the cells into their final 16-level per cell (QLC) state requires the data from the first pass to be read correctly. Any error made in reading the first pass data results in misplacement of the final QLC state. The ability to read the data from the 8-level per cell (TLC) state correctly requires relatively fine placement of this state. To do so, the first pass of the 8-16 programming technique needs to use relatively small gate steps and many verify steps. Consequently, the first pass of the foregoing 2-pass programming will also be relatively slow. Furthermore, depending on the expected raw bit error rate (RBER) of the read operation, reading of the three pages of TLC data in preparation of the second pass programming might need error correction on one or more of the pages which further slows down the overall programming. A fourth page of data is also provided and used in combination to the 3 pages of data that was read from TLC state to program the cells into the final 16 levels of the QLC state. For examples, the 16 levels may correspond to a binary 4 bit value (0 to 15) with the first 3 pages providing an initial 3 bits of the value and the fourth page providing the final fourth bit of the 4 bit value.

In another 2-pass programming technique, faster 2-pass programming can be achieved by programming into a 4-level per cell (MLC) state in the first pass based on two pages of user data and then programming into the final 16-level per cell (QLC) state in the second pass based on two more pages of user data. However, this 4-16 programming technique comes at the expense of more aggression from neighboring word-lines and exhibits loss of RWB compared to the 8-16 programming technique.

Another drawback of some other programming techniques is that an interruption or a power loss during the second pass (e.g., which can be a few milliseconds) results in the loss of data that was stored previously in the MLC/TLC state. Since this data was written at a time significantly (sometimes a few days) earlier than the 4th page of the data was provided to program the second pass, provisions are needed to provide immunity to or recovery from data loss in the event of such interruption/power loss. This problem results in further complexity of the system and/or programming technique.

In a QLC implementation according to some embodiments, in the first pass of programming a word-line WLn, four (4) pages of data may be provided by the system (e.g., as opposed to three pages of data in some other 8-16 programming techniques). The page data may be temporarily written to SLC blocks and may also be used to place the corresponding cells in the QLC block into a coarse 16-level per cell state. The coarse placement may reduce or minimize the Vt movement as a result of second pass programming and hence the aggression on a neighboring word-line WLn−1 (which may be already programmed into final 16-level per cell state before WLn is programmed is from coarse 16-level per cell state to final 16-level per cell state in the second pass programming of WLn). After a next neighboring word-line WLn+1 is programmed into a coarse 16-level per cell state, the second pass of programming WLn may be performed by first reading the corresponding SLC blocks internally and using the data from the SLC blocks to move cells in WLn to their fine 16-level per cell state.

Advantageously, in some embodiments the overall programming speed of a QLC NAND may be significantly improved (e.g., by more than 20%) while providing a comparable read window budget (RWB) as compared to some other 8-16 two pass programming techniques. Additionally, or alternatively, some embodiments may also advantageously be inherently immune or resilient to power loss during the second pass programming because prior to final QLC placement the data is available in the SLC blocks (e.g., the QLC block may be restored or programmed from the SLC blocks following an interruption in the programming between the first and second passes due to, for example, power interruption or loss).

Figure 4:
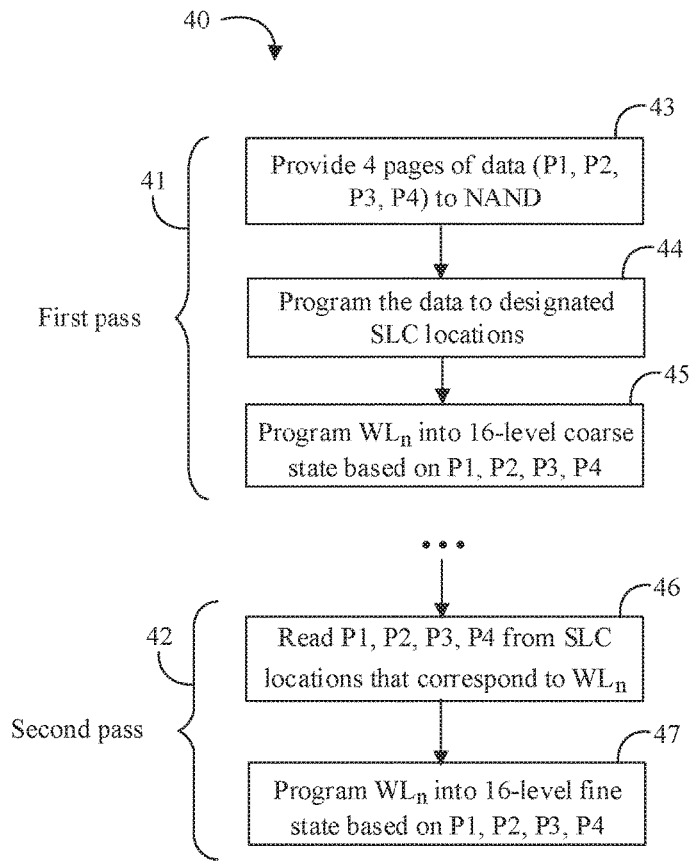
FIG. 4 is a flowchart of another example of a method of programming a memory according to an embodiment.

Turning now to FIG. 4, an embodiment of a method 40 of programming a memory may include a first pass 41 and a second pass 42. In the first pass 41 of programming a word-line WLn, four pages P1, P2, P3, and P4 of data may be provided to a multi-level memory at block 43. This data may immediately be written into designated single-level per cell (SLC) locations that correspond to WLn at block 44. The data may also be used to place WLn into a coarse 16-level state (e.g., as described in more detail below) at block 45. The coarse programming at block 45 may move the Vt of each cell close to its final placement, so that operating the second pass 42 of programming on WLn does not cause significant aggression on a neighboring word-line WLn−1. In the second pass 42 of programming WLn, the four pages P1, P2, P3, and P4 of data may be read from the corresponding SLC locations at block 46 and used to place WLn into a fine 16-level state at block 47.

Figure 5:
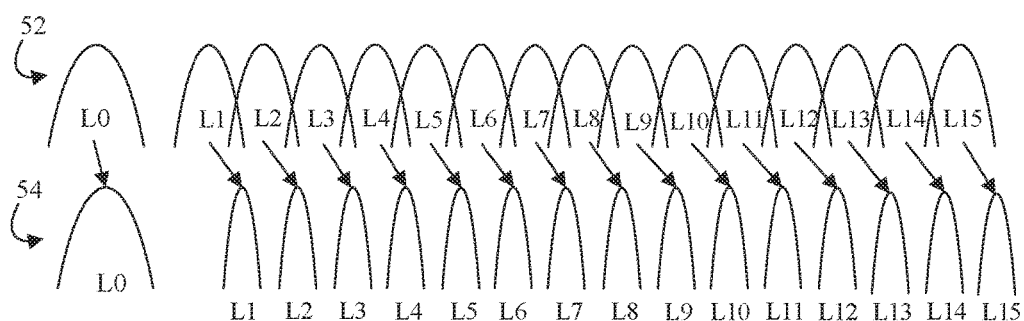
FIG. 5 is an illustrative diagram of a threshold voltage distribution according to an embodiment.

Turning now to FIG. 5, an illustrative Vt distribution may represent a first QLC programming pass 52 based on coarse placement and a second QLC programming pass 54 based on fine placement. Starting at an erased state (L0), during the first pass 52 of programming WLn four pages of data are provided and the cells are programmed in a coarse 16-level state. As shown in FIG. 5, the data in the coarse 16-level state is not readable, as schematically illustrated by broad levels that overlap each other. After a similar first pass coarse programming is performed on WLn+1, WLn will not be subject to significant aggression anymore, and the second pass 54 programming may be executed on WLn. To perform the second pass 54, the corresponding four pages of data may first be read from the designated SLC locations and then the cells of WLn may be placed in their final 16-level state (e.g., as schematically illustrated by narrower levels that do not overlap each other).

Because a copy of the data is stored in the corresponding SLC locations prior to programming the QLC cells to their final 16-level state, in accordance with some embodiments, the coarse 16-level placement in the first pass 52 advantageously does not need to be readable and therefore does not need to be tightly placed. Advantageously, some embodiments may use a very fast programming process without verifying the data. In terms of coarseness, in some embodiments, the first pass placement may be such that the Vt distribution of each level does not exceed the desired maximum Vt of the final 16-level placement plus some margin to account for worst case conditions of programming speed and aggression from a first pass placement of WLn+1.

Figure 6:
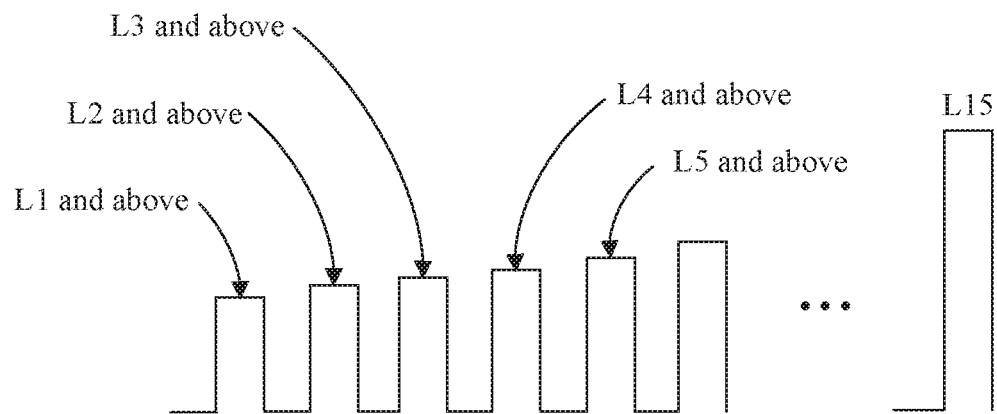
FIG. 6 is an illustrative diagram of programming pulses according to an embodiment.

Turning now to FIG. 6, an illustrative diagram may represent a sequence of program pulses during an embodiment of a first pass of programming QLC cells. In some other programming techniques, a sequence of programming pulses with increasing amplitude is applied to the selected WL. Each programming pulse is then followed by a staircase sequence to determine if each bit-line (BL) has reached its desired programming state (e.g., Vt of the cell is higher than the predetermined verify voltage) or not. At each programming pulse, BLs that have reached their desired programmed state are connected to a voltage, typically in the range of 2-3 V so that they are inhibited from further programming. BLs that have not reached their desired programmed stated are connected to a low voltage, such as ground signal, so that they are programmed. Furthermore, the verify step may include a special step to determine those BLs that have not reached their desired programmed state but are close to that. Typically these BLs are connected to a signal between the program voltage and inhibit voltage so that they are programmed at a reduced speed utilizing, for example, selective slow program convergence (SSPC). In a conventional 8-16 programming technique, for example, programming the first pass (TLC state) may require up to 20 or more programming pulses, each followed by a number of verify steps (e.g., three verify steps). As a result, the first pass may require up to 3 ms to finish in some other programming techniques.

In some embodiments, the first pass of the programming the QLC cells may advantageously be performed by applying a sequence of programming pulses to the selected WL without following each program pulse with a series of verify staircase sequences. As shown in FIG. 6, for example, the first program pulse may program all cells except those that belong to L0 (e.g., L0 BLs may be inhibited and all other BLs may receive the program signal). The second program pulse may program all cells except L0 and L1, and so on as illustrated in FIG. 6. Advantageously, some embodiments may utilize only 15 program pulses and no verify steps and may be performed much faster than other first pass programming techniques (e.g., less than 1 ms).

Figure 7:
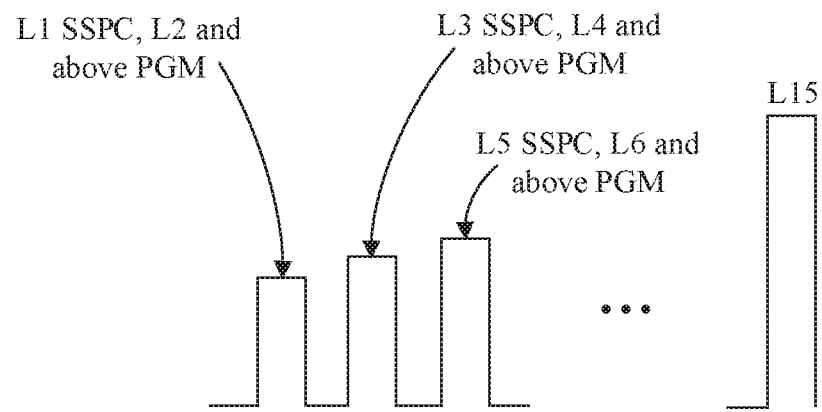
FIG. 7 is another illustrative diagram of programming pulses according to an embodiment.

Turning now to FIG. 7, in some embodiment, two groups of cells may be programmed at each program pulse. As illustrated in FIG. 7, the first program pulse may program L2 and above at full programming speed and L1 at a slower speed (e.g., L0 BLs may be inhibited; L2 and above BLs may be connected to program voltage (e.g., ground); and L1 BLs may be connected to an intermediate voltage). The second pulse may program L4 and above at the full speed and L3 at a slower speed, and so on. Advantageously, some embodiments may utilize a total of 8 program pulses (and no verify steps), which may reduce the program time of the first pass (e.g., to less than 500 μs).

In some embodiments, the first pass may also include programming the data in designated SLC locations. Because SLC utilizes a single-level placement, the programming may be done by applying a single pulse to the selected WL with no verify step. Such SLC programming is very fast (e.g., performed in 250 μs or less). Similarly, reading four pages of SLC data in preparation of the second pass programming can be done much faster than reading three pages of TLC data and advantageously may not require external error correction. In some embodiments, the size of the available SLC memory may be pre-configured or may be configured dynamically.

Figure 8:
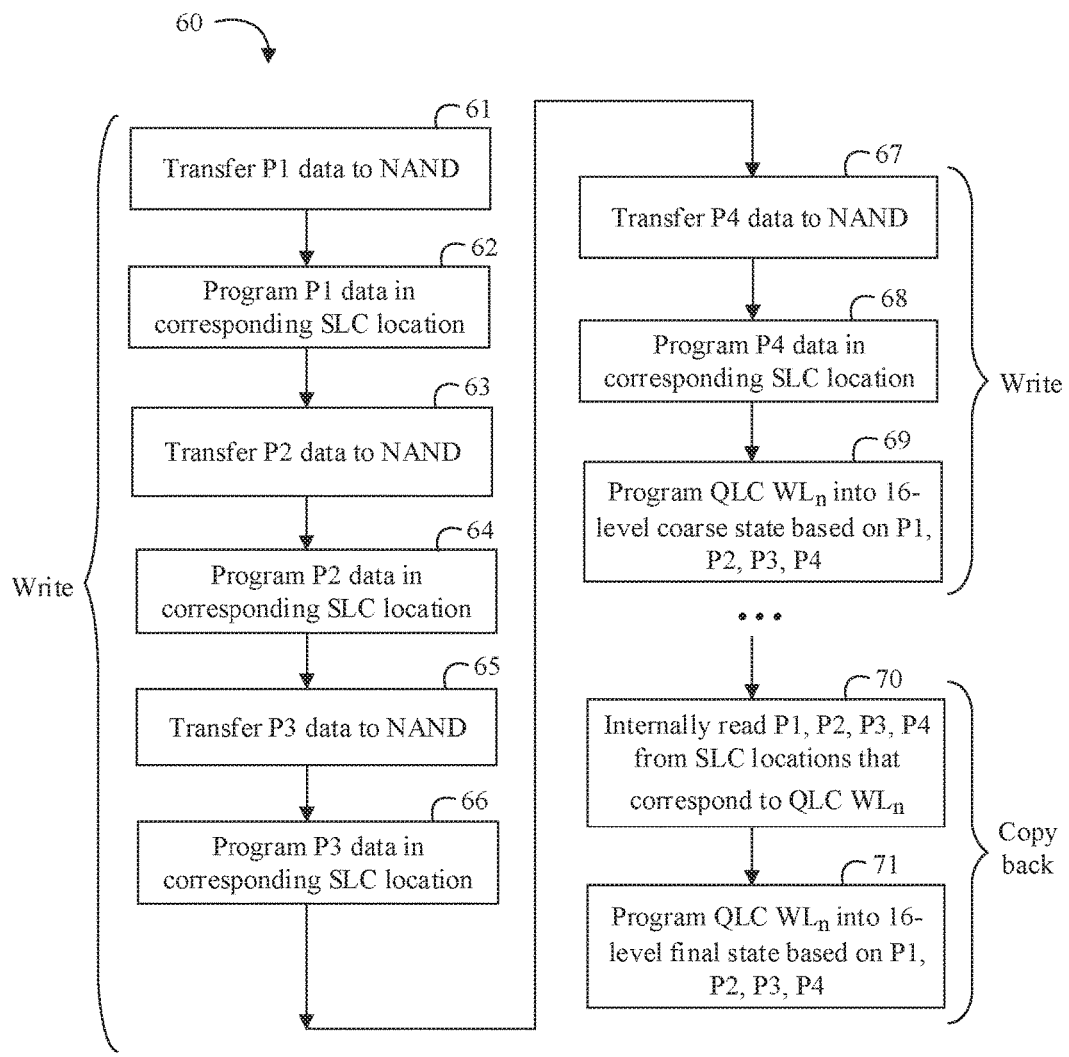
FIG. 8 is a flowchart of another example of a method of programming a memory according to an embodiment.

Turning now to FIG. 8, an embodiment of a method 60 of programming a memory may include transferring a first page P1 of data to the NAND at block 61 and programming the P1 data in corresponding SLC locations at block 62. The method 60 may include then transferring a second page P2 of data to the NAND at block 63 and programming the P2 data in corresponding SLC locations at block 64. The method 60 may include then transferring a third page P3 of data to the NAND at block 65 and programming the P3 data in corresponding SLC locations at block 66. The method 60 may include then transferring a fourth page P4 of data to the NAND at block 67 and programming the P4 data in corresponding SLC locations at block 68. The method 60 may include then programming the QLC WLn into 16-level coarse states based on the four pages P1, P2, P3, and P4 at block 69. Subsequently, the method 60 may include then internally reading the four pages P1, P2, P3, and P4 from the SLC locations corresponding to the QLC WLn at block 70 and programming the QLC WLn into 16-level final states based on the internally read pages P1, P2, P3, and P4 at block 71.

In a first pass of the programming, for example, the four pages of data may be transferred to the NAND and stored in designated SLC locations. The same data may be kept inside the page buffer of the NAND die and used to program the corresponding QLC WL into 16 coarse states. In a second pass of the programming, the four pages of data may be read internally from the SLC locations without transferring the data outside the NAND die and used to program the corresponding QLC WL into the final 16-level states. In some embodiments, the programming of the QLC WL into coarse states may be performed immediately after the four pages of data are programmed into the SLC locations. The second pass of programming the QLC WLn may be performed after the first pass of coarse programming the data that corresponds to WLn+1 is finished. To further increase the speed of programming the data into SLC pages, each page of data may advantageously be programmed into the designated SLC locations while the next page of the data is being transferred into the NAND.

Figure 9:
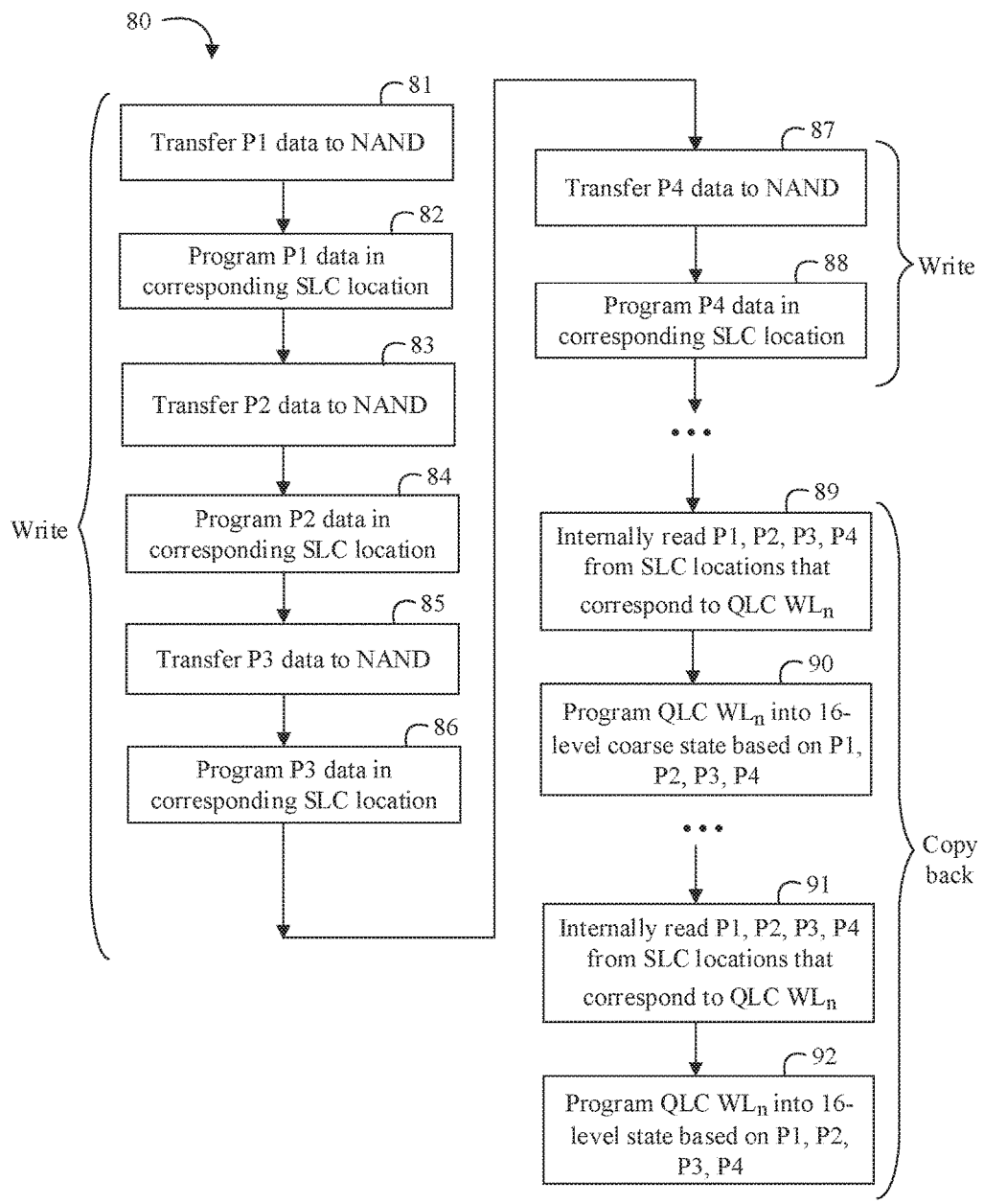
FIG. 9 is a flowchart of another example of a method of programming a memory according to an embodiment.

Turning now to FIG. 9, an embodiment of a method 80 of programming a memory may include transferring a first page P1 of data to the NAND at block 81 and programming the P1 data in corresponding SLC locations at block 82. The method 80 may include then transferring a second page P2 of data to the NAND at block 83 and programming the P2 data in corresponding SLC locations at block 84. The method 80 may include then transferring a third page P3 of data to the NAND at block 85 and programming the P3 data in corresponding SLC locations at block 86. The method 80 may include then transferring a fourth page P4 of data to the NAND at block 87 and programming the P4 data in corresponding SLC locations at block 88. The method 80 may include then internally reading the four pages P1, P2, P3, and P4 from SLC locations that correspond to the QLC WLn at block 89 and programming the QLC WLn into 16-level coarse states based on the internally read four pages P1, P2, P3, and P4 at block 90. Subsequently, the method 80 may include then internally reading the four pages P1, P2, P3, and P4 from the SLC locations corresponding to the QLC WLn at block 91 and programming the QLC WLn into 16-level final states based on the internally read pages P1, P2, P3, and P4 at block 92.

In some embodiments of the method 80, the data may not be directly used to program the corresponding QLC WL into the 16-level state during a write operation. Instead (e.g., as may be initiated by a copy-back command), the four pages of the data that may be needed to program the QLC WLn may be read internally from the corresponding SLC locations. The data may then be used to program the QLC WLn into the 16-level coarse states. The method 80 may then internally read four pages of the data that may be needed to program WLn+1 from corresponding SLC locations and programs the QLC WLn+1 into the 16-level coarse states. Subsequently, the method 80 may again internally read the four pages needed to program the QLC WLn from the designated SLC locations and use the data to program the QLC WLn into the final 16-level states.

Although illustrative examples have been described in connection with a first level cell portion corresponding to a SLC memory and a second level cell portion corresponding to a QLC memory, other numbers of levels are within the scope of some embodiments. For example, some embodiments may include a first level cell portion that corresponds to a MLC memory. Similarly, some embodiments may be beneficial for a second level cell portion that corresponds to a TLC memory and/or more than 16 levels.

Figure 10:
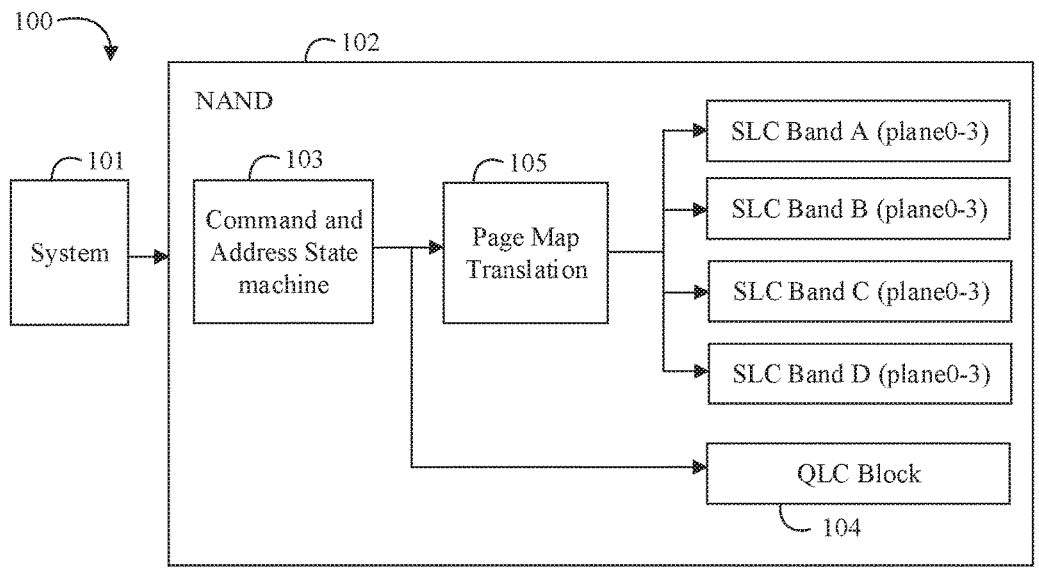
FIG. 10 is a block diagram of another example of an electronic processing system according to an embodiment.

Turning now to FIG. 10, an embodiment of an electronic processing system 100 may include a computing system 101 coupled to a multi-level NAND device 102. The NAND device 102 may include a command and address state machine 103 coupled to a QLC block 104. The state machine 103 may also be coupled to a page map translator 105, which may be coupled to four SLC bands A, B, C, and D. The number of SLC bands and/or the size of the bands may be pre-configured or may be dynamically configured. The page map translator 105 may translate between QLC addresses and the corresponding SLC addresses. For example, the system 100 may determine and manage the SLC addresses that correspond to particular QLC addresses. A storage device such as a solid-state drive (SSD) may include a controller chip and one or more NAND dies. In the system 100, the translation between the QLC addresses and the corresponding SLC addresses may be performed inside each NAND die.

Figure 11:
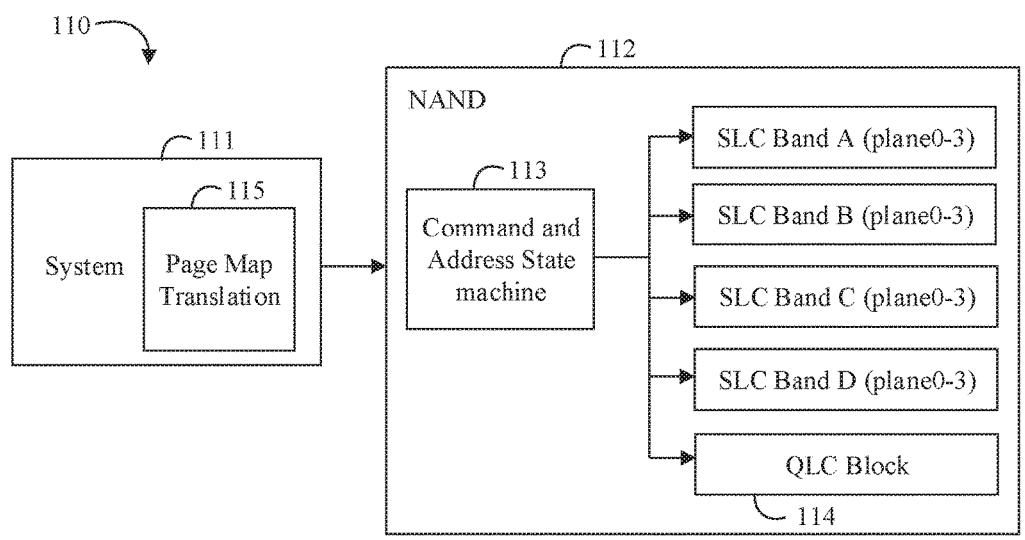
FIG. 11 is a block diagram of another example of an electronic processing system according to an embodiment.

Turning now to FIG. 11, an embodiment of an electronic processing system 110 may include a computing system 111 coupled to a multi-level NAND device 112. The NAND device 112 may include a command and address state machine 113 coupled to a QLC block 114 and four SLC bands A, B, C, and D. The number of SLC bands and/or the size of the bands may be pre-configured or may be dynamically configured. The computing system 111 may include a page map translator 115. The page map translator 115 may translate between QLC addresses and the corresponding SLC addresses. For example, the system 110 may determine and manage the SLC addresses that correspond to particular QLC addresses. A storage device such as a SSD may include a controller chip and one or more NAND dies. In the system 110, the translation between the QLC addresses and the corresponding SLC addresses may be performed by a NAND controller in the computing system 111.

Additional Notes and Examples

Example 1 may include an electronic processing system, comprising a processor, a multi-level NAND memory communicatively coupled to the processor, the multi-level NAND memory including a single-level cell (SLC) portion, and a quad-level cell (QLC) portion, and a memory programmer communicatively coupled to the multi-level NAND memory to program the multi-level NAND memory, wherein the memory programmer is further to program the SLC portion in a first pass, coarse program the QLC portion in the first pass, and fine program the QLC portion in a second pass from data programmed in the SLC portion in the first pass.

Example 2 may include the system of Example 1, further comprising a page map translator communicatively coupled to the multi-level NAND memory to translate addresses between the SLC portion and the QLC portion.

Example 3 may include the system of Example 2, wherein the page map translator is integrated on a same die with the multi-level NAND memory.

Example 4 may include the system of any of Examples 1 to 3, wherein the memory programmer is further to fine program the QLC portion from data stored in the SLC portion following a power interruption.

Example 5 may include the system of any of Examples 1 to 3, wherein the data programmed in the QLC portion in the first pass is unverified.

Example 6 may include the system of any of Examples 1 to 3, further comprising a page buffer communicatively coupled to the memory programmer to store a page of data, wherein the memory programmer is further to program the SLC portion from a first page of data stored in the page buffer at a same time as a second page of data is transferred to the page buffer.

Example 7 may include a memory programmer apparatus, comprising a first-level programmer to program a first-level cell portion of a multi-level non-volatile memory in a first pass, a coarse programmer to coarse program a second-level cell portion of the multi-level memory in the first pass, wherein the second-level cell portion includes more voltage levels than the first-level cell portion, and a fine programmer to fine program the second-level cell portion of the multi-level memory in a second pass from data programmed in the first-level cell portion in the first pass.

Example 8 may include the apparatus of Example 7, further comprising a page map translator communicatively coupled to the first-level programmer, the coarse programmer, and the fine programmer to translate addresses between the first-level cell portion and the second-level cell portion.

Example 9 may include the apparatus of Example 8, wherein the page map translator is integrated on a same die with the multi-level memory.

Example 10 may include the apparatus of any of Examples 7 to 9, wherein the fine programmer is further to fine program the second-level cell portion from data stored in the first-level cell portion following a power interruption.

Example 11 may include the apparatus of any of Examples 7 to 9, wherein the data programmed in the second-level cell portion in the first pass is unverified.

Example 12 may include the apparatus of any of Examples 7 to 9, further comprising a page buffer communicatively coupled to the first-level programmer to store a page of data, wherein the first-level programmer is further to program the first-level cell portion from a first page of data stored in the page buffer at a same time as a second page of data is transferred to the page buffer.

Example 13 may include a method of programming a memory, comprising programming a first-level cell portion of a multi-level memory in a first pass, coarse programming a second-level cell portion of the multi-level memory in the first pass, wherein the second-level cell portion includes more levels than the first-level cell portion, and fine programming the second-level cell portion of the multi-level memory in a second pass from data programmed in the first-level cell portion in the first pass.

Example 14 may include the method of Example 13, further comprising translating addresses between the first-level cell portion and the second-level cell portion.

Example 15 may include the method of Example 14, further comprising integrating address translation on a same die with the multi-level memory.

Example 16 may include the method of any of Examples 13 to 15, further comprising fine programming the second-level cell portion from data stored in the first-level cell portion following a power interruption.

Example 17 may include the method of any of Examples 13 to 15, wherein the data programmed in the second-level cell portion in the first pass is unverified.

Example 18 may include the method of any of Examples 13 to 15, further comprising programming the first-level cell portion from a first page of data at a same time as a second page of data is transferred to the multi-level memory.

Example 19 may include at least one computer readable medium, comprising a set of instructions, which when executed by a computing device, cause the computing device to program a first-level cell portion of a multi-level memory in a first pass, coarse program a second-level cell portion of the multi-level memory in the first pass, wherein the second-level cell portion includes more levels than the first-level cell portion, and fine program the second-level cell portion of the multi-level memory in a second pass from data programmed in the first-level cell portion in the first pass.

Example 20 may include the at least one computer readable medium of Example 19, comprising a further set of instructions, which when executed by the computing device, cause the computing device to translate addresses between the first-level cell portion and the second-level cell portion.

Example 21 may include the at least one computer readable medium of Example 20, comprising a further set of instructions, which when executed by the computing device, cause the computing device to integrate address translation on a same die with the multi-level memory.

Example 22 may include the at least one computer readable medium of any of Examples 19 to 21, comprising a further set of instructions, which when executed by the computing device, cause the computing device to fine program the second-level cell portion from data stored in the first-level cell portion following a power interruption.

Example 23 may include the at least one computer readable medium of any of Examples 19 to 21, wherein the data programmed in the second-level cell portion in the first pass is unverified.

Example 24 may include the at least one computer readable medium of any of Examples 19 to 21, comprising a further set of instructions, which when executed by the computing device, cause the computing device to program the first-level cell portion from a first page of data at a same time as a second page of data is transferred to the multi-level memory.

Example 25 may include a memory programmer apparatus, comprising means for programming a first-level cell portion of a multi-level memory in a first pass, means for coarse programming a second-level cell portion of the multi-level memory in the first pass, wherein the second-level cell portion includes more levels than the first-level cell portion, and means for fine programming the second-level cell portion of the multi-level memory in a second pass from data programmed in the first-level cell portion in the first pass.

Example 26 may include the apparatus of Example 25, further comprising means for translating addresses between the first-level cell portion and the second-level cell portion.

Example 27 may include the apparatus of Example 26, further comprising means for integrating address translation on a same die with the multi-level memory.

Example 28 may include the apparatus of any of Examples 25 to 27, further comprising means for fine programming the second-level cell portion from data stored in the first-level cell portion following a power interruption.

Example 29 may include the apparatus of any of Examples 25 to 27, wherein the data programmed in the second-level cell portion in the first pass is unverified.

Example 30 may include the apparatus of any of Examples 25 to 27, further comprising means for programming the first-level cell portion from a first page of data at a same time as a second page of data is transferred to the multi-level memory.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic processing system, comprising:
a processor;
a multi-level NAND memory communicatively coupled to the processor, the multi-level NAND memory including:
a single-level cell (SLC) portion, and
a quad-level cell (QLC) portion;
a memory programmer communicatively coupled to the multi-level NAND memory to program the multi-level NAND memory, wherein the memory programmer is further to:
program the SLC portion in a first pass,
coarse program the QLC portion in the first pass, and
fine program the QLC portion in a second pass from data programmed in the SLC portion in the first pass; and
a page buffer communicatively coupled to the memory programmer to store a page of data, wherein the memory programmer is further to program the SLC portion from a first page of data stored in the page buffer at a same time as a second page of data is transferred to the page buffer.

2. The system of claim 1, further comprising:
a page map translator communicatively coupled to the multi-level NAND memory to translate addresses between the SLC portion and the QLC portion.

3. The system of claim 2, wherein the page map translator is integrated on a same die with the multi-level NAND memory.

4. The system of claim 1, wherein the memory programmer is further to fine program the QLC portion from data stored in the SLC portion after a power interruption.

5. The system of claim 1, wherein the data programmed in the QLC portion in the first pass is unverified.

6. A memory programmer apparatus, comprising:
a first-level programmer to program a first-level cell portion of a multi-level memory in a first pass;
a coarse programmer to coarse program a second-level cell portion of the multi-level memory in the first pass, wherein the second-level cell portion includes more levels than the first-level cell portion; and
a fine programmer to fine program the second-level cell portion of the multi-level memory in a second pass from data programmed in the first-level cell portion in the first pass.

7. The apparatus of claim 6, further comprising:
a page map translator communicatively coupled to the first-level programmer, the coarse programmer, and the fine programmer to translate addresses between the first-level cell portion and the second-level cell portion.

8. The apparatus of claim 7, wherein the page map translator is integrated on a same die with the multi-level memory.

9. The apparatus of claim 6, wherein the fine programmer is further to fine program the second-level cell portion from data stored in the first-level cell portion after a power interruption.

10. The apparatus of claim 6, wherein the data programmed in the second-level cell portion in the first pass is unverified.

11. The apparatus of claim 6, further comprising:
a page buffer communicatively coupled to the first-level programmer to store a page of data, wherein the first-level programmer is further to program the first-level cell portion from a first page of data stored in the page buffer at a same time as a second page of data is transferred to the page buffer.

12. A method of programming a memory, comprising:
programming a first-level cell portion of a multi-level memory in a first pass;
coarse programming a second-level cell portion of the multi-level memory in the first pass, wherein the second-level cell portion includes more levels than the first-level cell portion; and
fine programming the second-level cell portion of the multi-level memory in a second pass from data programmed in the first-level cell portion in the first pass.

13. The method of claim 12, further comprising:
translating addresses between the first-level cell portion and the second-level cell portion.

14. The method of claim 13, further comprising:
integrating address translation on a same die with the multi-level memory.

15. The method of claim 12, further comprising:
fine programming the second-level cell portion from data stored in the first-level cell portion after a power interruption.

16. The method of claim 12, wherein the data programmed in the second-level cell portion in the first pass is unverified.

17. The method of claim 12, further comprising:
programming the first-level cell portion from a first page of data at a same time as a second page of data is transferred to the multi-level memory.

18. At least one computer readable medium, comprising a set of instructions, which when executed by a computing device, cause the computing device to:
program a first-level cell portion of a multi-level memory in a first pass;
coarse program a second-level cell portion of the multi-level memory in the first pass, wherein the second-level cell portion includes more levels than the first-level cell portion; and
fine program the second-level cell portion of the multi-level memory in a second pass from data programmed in the first-level cell portion in the first pass.

19. The at least one computer readable medium of claim 18, comprising a further set of instructions, which when executed by the computing device, cause the computing device to:
translate addresses between the first-level cell portion and the second-level cell portion.

20. The at least one computer readable medium of claim 19, comprising a further set of instructions, which when executed by the computing device, cause the computing device to:
integrate address translation on a same die with the multi-level memory.

21. The at least one computer readable medium of claim 18, comprising a further set of instructions, which when executed by the computing device, cause the computing device to:
fine program the second-level cell portion from data stored in the first-level cell portion after a power interruption.

22. The at least one computer readable medium of claim 18, wherein the data programmed in the second-level cell portion in the first pass is unverified.

23. The at least one computer readable medium of claim 18, comprising a further set of instructions, which when executed by the computing device, cause the computing device to:
program the first-level cell portion from a first page of data at a same time as a second page of data is transferred to the multi-level memory.

24. A method of programming a memory, comprising:
programming a multi-level NAND memory including a single-level cell (SLC) portion and a quad-level cell (QLC) portion, comprising:
programming the SLC portion in a first pass from a first page of data stored in a page buffer at a same time as a second page of data is transferred to the page buffer;
coarse programming the QLC portion in the first pass; and
fine programming the QLC portion in a second pass from data programmed in the SLC portion in the first pass.

25. At least one computer readable medium, comprising a set of instructions, which when executed by a computing device, cause the computing device to:
program a multi-level NAND memory including a single-level cell (SLC) portion and a quad-level cell (QLC) portion, wherein the computing device is to:
program the SLC portion in a first pass from a first page of data stored in a page buffer at a same time as a second page of data is transferred to the page buffer;
coarse program the QLC portion in the first pass; and
fine program the QLC portion in a second pass from data programmed in the SLC portion in the first pass.

* * * * *